United States Patent
Volpone et al.

(10) Patent No.: US 9,979,167 B1
(45) Date of Patent: May 22, 2018

(54) DEVICE AND METHOD FOR SPLICING SHIELDED WIRE CABLES

(71) Applicant: Delphi Technologies, Inc., Troy, MI (US)

(72) Inventors: Thomas A. Volpone, Cortland, OH (US); Troy A. Iler, Salem, OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days. days.

(21) Appl. No.: 15/687,590

(22) Filed: Aug. 28, 2017

(51) Int. Cl.
| | |
|---|---|
| *H02G 1/00* | (2006.01) |
| *H01B 13/012* | (2006.01) |
| *H05K 9/00* | (2006.01) |
| *H01B 7/282* | (2006.01) |
| *H01R 13/6592* | (2011.01) |
| *H01R 4/48* | (2006.01) |
| *H01B 7/00* | (2006.01) |

(52) U.S. Cl.
CPC ........... *H02G 1/005* (2013.01); *H01B 7/0045* (2013.01); *H01B 7/282* (2013.01); *H01B 13/01263* (2013.01); *H01R 4/48* (2013.01); *H01R 13/6592* (2013.01); *H05K 9/0098* (2013.01)

(58) Field of Classification Search
CPC ......... H02G 1/005; H01B 7/0045; H01R 4/48
See application file for complete search history.

(56) References Cited

U.S. PATENT DOCUMENTS

| | | | | |
|---|---|---|---|---|
| 4,944,700 A | * | 7/1990 | Simon | H01R 4/30 439/801 |
| 5,081,696 A | * | 1/1992 | Beck | F24H 9/2021 174/5 SG |
| 6,095,829 A | | 8/2000 | Burland | |
| 7,098,643 B1 | * | 8/2006 | Kim | G01R 31/041 324/539 |
| 7,220,152 B2 | * | 5/2007 | Jeong | H01R 13/2421 439/862 |
| 7,744,384 B2 | * | 6/2010 | Wu | H05K 1/0215 439/95 |
| 7,973,239 B2 | * | 7/2011 | Koyama | H01R 9/0506 174/74 R |
| 7,997,945 B2 | | 8/2011 | Schmitz | |
| 8,052,428 B2 | * | 11/2011 | Tsao | H01R 13/24 439/66 |

(Continued)

*Primary Examiner* — Hoa C Nguyen
*Assistant Examiner* — Amol Patel
(74) *Attorney, Agent, or Firm* — Robert J. Myers (57) ABSTRACT

A wire cable assembly, such as those used in electric or hybrid electric vehicles, having a plurality of shielded wire cables that are spliced together is presented. The assembly. A resilient shield clip electrically interconnects the shield conductors of at least a portion of the plurality of shielded wire cables. The shield clip defines a first wire receiving portion that is characterized as being omega-shaped in cross section. A first shield conductor portion is received within the first wire receiving portion. The shield clip further defines second and third wire receiving portions in which the second and third shield conductor portions are received respectively. A conductive shield sleeve is in electrical contact with the shield clip and encloses the first, second, and third shield conductor portions. A method of splicing shielded wire cables using such a shield clip is also presented herein.

20 Claims, 7 Drawing Sheets

(56) References Cited

U.S. PATENT DOCUMENTS

| | | | |
|---|---|---|---|
| 8,367,930 B2* | 2/2013 | Liang | H01R 4/4809 |
| | | | 174/50 |
| 9,178,287 B2* | 11/2015 | Tanaka | H01R 4/00 |
| 2005/0247827 A1 | 11/2005 | Moher | |
| 2009/0314511 A1* | 12/2009 | Hagi | H01R 4/726 |
| | | | 174/78 |
| 2014/0220834 A1* | 8/2014 | Rizzo | H01L 31/042 |
| | | | 439/834 |
| 2015/0114711 A1* | 4/2015 | Dew | H02G 15/1806 |
| | | | 174/72 A |

* cited by examiner

DEVICE AND METHOD FOR SPLICING SHIELDED WIRE CABLES

TECHNICAL FIELD OF THE INVENTION

The invention generally relates to a splicing device and a method for joining shielded wire cables.

BACKGROUND OF THE INVENTION

Shielded wire cables typically include an insulated center conductor and a separate insulated shield conductor surrounding the center conductor insulation. The shield conductor may consist of a braided wire mesh, metal foil, or metalized film. The cables typically have a second insulation layer covering the shield conductor. Shielded wire cables have been long used for communications systems, such as in cable television transmission lines. Shielded wire cables are also finding use in high voltage applications in electric and hybrid electric vehicles. When shielded wire cables are spliced together, there is usually a need to electrically connect the shield conductors of the spliced cables as well as the center conductor, in order to maintain electrical continuity of the shield conductors. Interconnecting the shield conductors may be complicated because the shield conductors must be cut back from the spliced ends of the cable in order to join the center conductors. Interconnecting the shield conductors may be further complicated in a one-to-many splicing configuration, sometimes referred to as a Y-splice or H-splice.

A splicing device and a method for splicing shielded wire cables is described in U.S. Pat. No. 9,543,747 issued Jan. 10, 2017, herein incorporated by reference in it entirely. The splicing device described includes shielded cables having center conductors that are sonically welded together. The insulating jackets of the shielded are stripped back to expose the shield braid which then must be electrically connected to provide proper EMI shielding of each of the spliced shielded cables. The interconnection of the shield braids of the shielded cables is provided by braided strapping or conductive tape, which must interface with each braided shield. When multiple wires with different diameter, i.e. different wire gauge, are spliced, it is difficult to insure that all of the wire shields have proper electrical and mechanical interface with the braided strapping or conductive tape. Also, although the wires are configured in a general horizontal alignment, the wires are fanned out with a defined spacing to easily align with portals in an outer housing containing the spliced section of the cables. Therefore a splicing device and method that can more easily accommodate wires of differing diameter and provide alignment of the cables remains desired.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with one embodiment of this invention, a wire harness assembly is provided. The wire harness assembly includes a first shielded wire cable having a first core conductor portion and a first shield conductor portion, a second shielded wire cable having a second core conductor portion and a second shield conductor portion, and a third shielded wire cable having a third core conductor portion and a third shield conductor portion. The first, second, and third core conductor portions are electrically interconnected. A diameter of the first shielded wire cable is different than a diameter of the second shielded wire cable. The wire harness assembly also includes a resilient shield clip formed of a conductive material in electrical contact with the first, second, and third shield conductor portions. The shield clip defines a first wire receiving portion that is characterized as being omega-shaped in cross section. The first shield conductor portion is received within the first wire receiving portion. The shield clip further defines second and third wire receiving portions in which the second and third shield conductor portions are received respectively. The wire harness assembly further includes a conductive shield sleeve in electrical contact with the shield clip and enclosing the first, second, and third shield conductor portions.

The second and third receiving portions may be characterized as having an arcuate shape in cross section. The second and third shield conductor portions are received within the second and third receiving portions respectively.

The second and third shielded wire cables may have the same diameter. Alternatively, the first and third shielded wire cables have the same diameter.

The first, second, and third core conductor portions are mechanically joined by a welding process, such as a sonic welding process.

The conductive shield sleeve may be formed of braided metallic wires or a conductive tape. The conductive shield sleeve may be in electrical contact with the first shield conductor portion but not in direct mechanical contact with the first shield conductor portion.

The wire harness assembly may further include a first insulator enclosing the joined first, second, and third core conductor portions and a second insulator enclosing the conductive shield sleeve.

In accordance with another embodiment of this invention, a method of manufacturing a wire harness assembly is provided. The method includes the steps of providing a first shielded wire cable having a first core conductor portion and a first shield conductor portion, providing a second shielded wire cable having a second core conductor portion and a second shield conductor portion, and providing a third shielded wire cable having a third core conductor portion and a third shield conductor portion. A diameter of the first shielded wire cable is different than a diameter of the second shielded wire cable. The method further includes the step of joining the first, second, and third core conductor portions, thereby electrically interconnecting the first, second, and third core conductor portions, providing a resilient shield clip formed of a conductive material defining a first wire receiving portion characterized as being omega-shaped in cross section and a second and third wire receiving portion configured to receive the second and third shield conductor portions, disposing the first, second, and third shield conductor portions within the first, second, and third wire receiving portions respectively, thereby electrically interconnecting the first, second, and third shield conductor portions, and wrapping a conductive shield sleeve the first, second, and third shield conductor portions. The conductive shield sleeve is brought into electrical contact with the shield clip, thereby electrically interconnecting the first, second, and third shield conductor portions with the shield clip.

The second and third receiving portions may be characterized as having an arcuate shape in cross section.

The second and third shielded wire cables have the same diameter or the first and third shielded wire cables may have the same diameter.

The step of joining the first, second, and third core conductor portions may be performed by a welding process, such as a sonic welding process.

The conductive shield sleeve may be formed of braided metallic wires or formed of a conductive tape.

The conductive shield sleeve may be in electrical contact with the first shield conductor portion while not in direct mechanical contact with the first shield conductor portion.

The method may further include the steps of disposing the joined first, second, and third core conductor portions within a first insulator and disposing the conductive shield sleeve within a second insulator enclosing.

Further features and advantages of the invention will appear more clearly on a reading of the following detailed description of the preferred embodiment of the invention, which is given by way of non-limiting example only and with reference to the accompanying drawings.

BRIEF DESCRIPTION OF THE SEVERAL
VIEWS OF THE DRAWING

The present invention will now be described, by way of example with reference to the accompanying drawings, in which.

DETAILED DESCRIPTION OF THE
INVENTION

Described herein are devices and a methods for splicing three or more shielded wire cables together. The devices and methods may be used to splice shielded wire cables with a single center conductor, i.e. solid wire, or multiple center connectors, i.e. stranded wire. The devices and methods described herein may also be used to splice three or more shielded wire cables to form a H-splice. The devices and methods described herein may be used for splicing a variety of shielded wire cables types, for example high voltage shielded wire cables designed for electrical or hybrid electrical vehicles.

Figure 1:
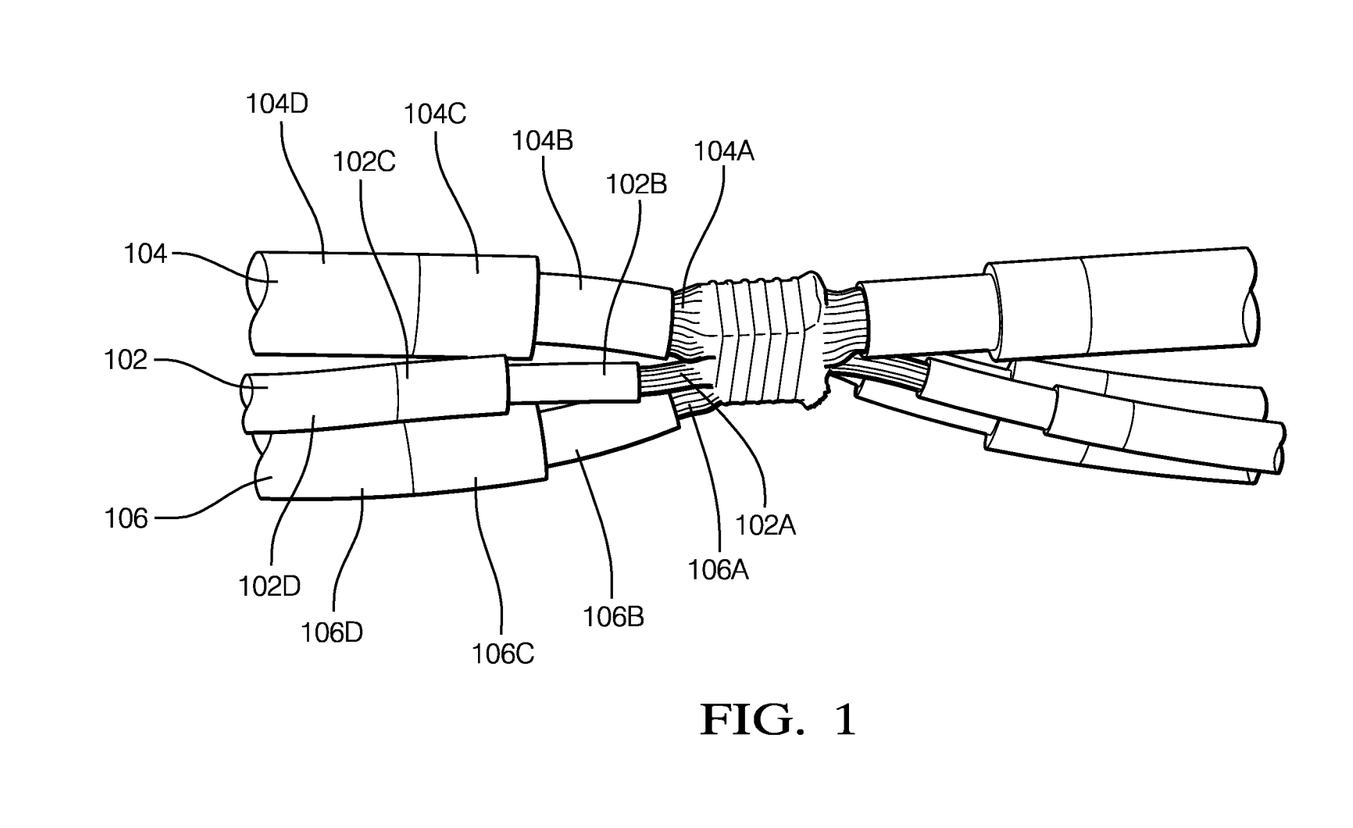
FIG. 1 is a top view of a shielded wire harness assembly having a spliced joint in accordance with a first embodiment.
Figure 2:
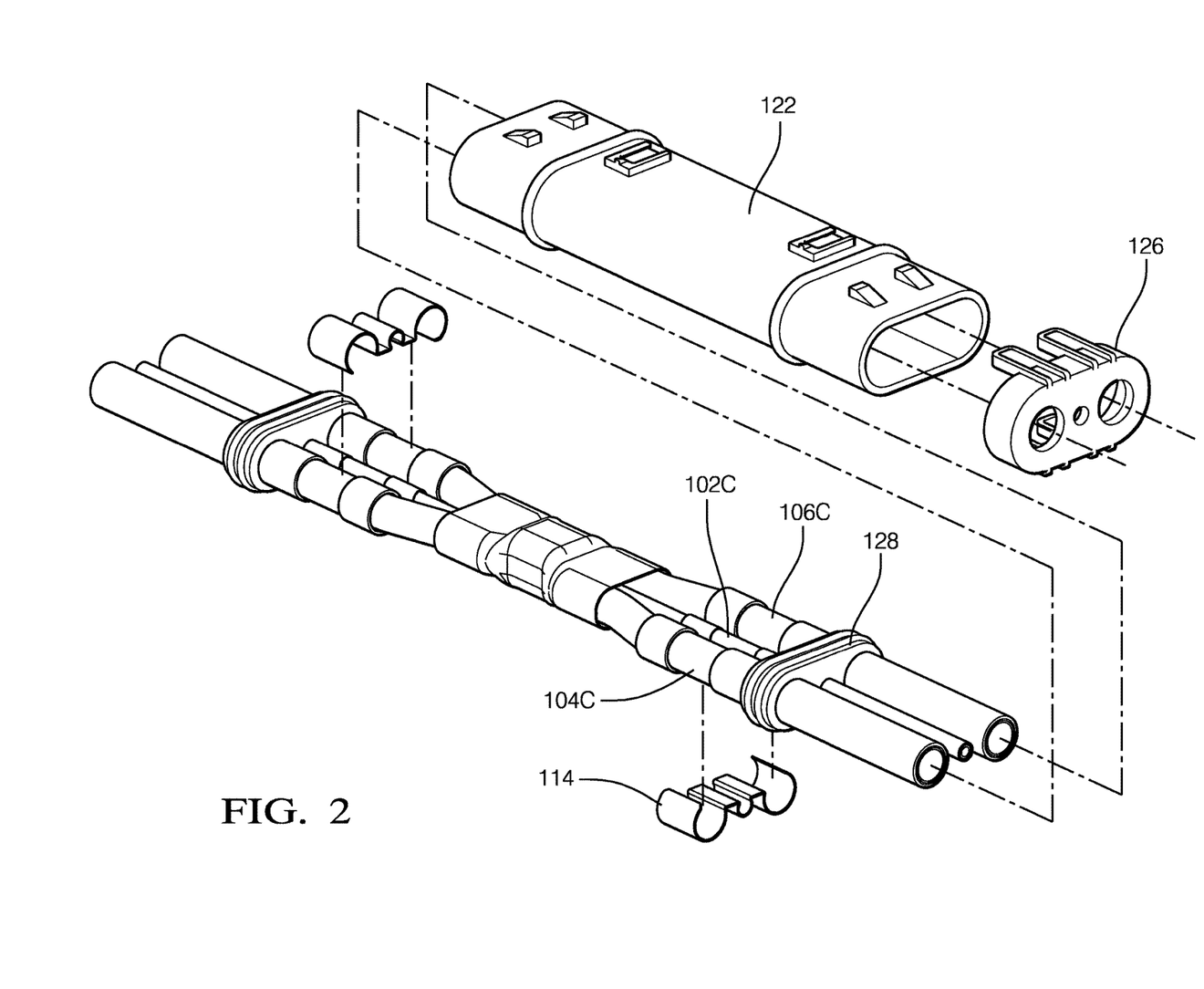
FIG. 2 is an exploded view of a shielded wire harness assembly having a spliced joint in accordance with the first embodiment.

FIG. 1 illustrates a non-limiting example of a wire harness assembly, hereinafter referred to as the assembly 100 that includes three shielded wire cables 102, 104, 106 that are spliced together in a double H-splice configuration. The assembly 100 includes a device configured to make a splice connection between the three shielded wire cables 102, 104, 106, hereinafter referred to as a splicing device. The three shielded wire cables 102, 104, 106 each have a core conductor 102A, 104A, 106A respectively that is axially surrounded by an inner insulation jacket 102B, 104B, 106B respectively. The inner insulation jackets 102B, 104B, 106B are axially surrounded by a shield conductor 102C, 104C, 106C respectively. The shield conductors 102C, 104C, 106C are axially surrounded by an outer insulation jacket 102D, 104D, 106D respectively. The core conductors 102A, 104A, 106A are preferably formed of a stranded, i.e. multi-wire core but may also be formed of a solid single wire core. The shield conductors 102C, 104C, 106C are preferably formed of a woven wire mesh, but may also be formed of an electrical conductive foil, e.g. a copper foil, aluminum foil, or a metallized plastic foil. As illustrated in FIG. 1, the core conductors 102A, 104A, 106A are attached to one another by a welding process, preferably a sonic welding process although other welding processes such as resistance welding, soldering, brazing may be employed. This welding proves electrically interconnects the core conductors 102A, 104A, 106A. As shown in FIG. 2, the first shielded wire cable 102 has a smaller diameter than the second and third wire cables 104, 106.

As illustrated in FIG. 2, a portion of the inner insulation jackets 102B, 104B, 106B, shield conductors 102C, 104C, 106C, and outer insulation jackets 102D, 104D, 106D, are removed to expose portions of the core conductors 102A, 104A, 106A. The inner insulation jackets 102B, 104B, 106B, shield conductors 102C, 104C, 106C, and outer insulation jackets 102D, 104D, 106D are stripped to expose portions of the shield conductors 102C, 104C, 106C.

An additional portion of each of the shield conductors 102C, 104C, 106C may be removed or cut way to provide adequate voltage creepage distance to prevent a leakage current between the core conductors 102A, 104A, 106A and the shield conductors 102C, 104C, 106C, thereby exposing inner insulation jackets 102B, 104B, 106B of the shielded wire cables 102, 104, 106. The exposed shield conductors 102C, 104C, 106C may be folded back over the outer insulation jackets 102D, 104D, 106D and an inner ferrule may be placed between the inner insulation jackets 102B, 104B, 106B and the exposed shield conductors 102C, 104C, 106C of each of the shielded wire cables 102, 104, 106 and an outer ferrule may be placed over each of the exposed shield conductors 102C, 104C, 106C to provide a robust connection point for the shield conductors 102C, 104C, 106C.

The joined core conductors 102A, 104A, 106A are enclosed within an inner insulator 112 formed of dielectric material to prevent inadvertent electrical contact with the conductors. The inner insulator 112 in the illustrated example is formed by applying heat shrink tubing formed of a thermoplastic such as polyolefin, polyvinyl chloride (PVC), polytetrafluoroethylene (PTFE), or fluorinated ethylene propylene (FEP).

Other embodiments may be envisioned in which the inner insulator is a housing formed of a polymer material, such as glass-filled polyamide (commonly known by the trade name NYLON) or polybutylene terephthalate (PBT). This inner insulator could be formed using an injection molding process or other plastic forming processes well known to those skilled in the art. This alternative inner insulator may be formed by two identical halves that are designed to enclose the exposed core conductors and the exposed inner insulation jackets of the shielded wire cables. In yet other alternative embodiments, the inner insulator may be a cloth or plastic tape wrapped about the joined core conductors. The tape may also include an adhesive backing.

Figure 3:
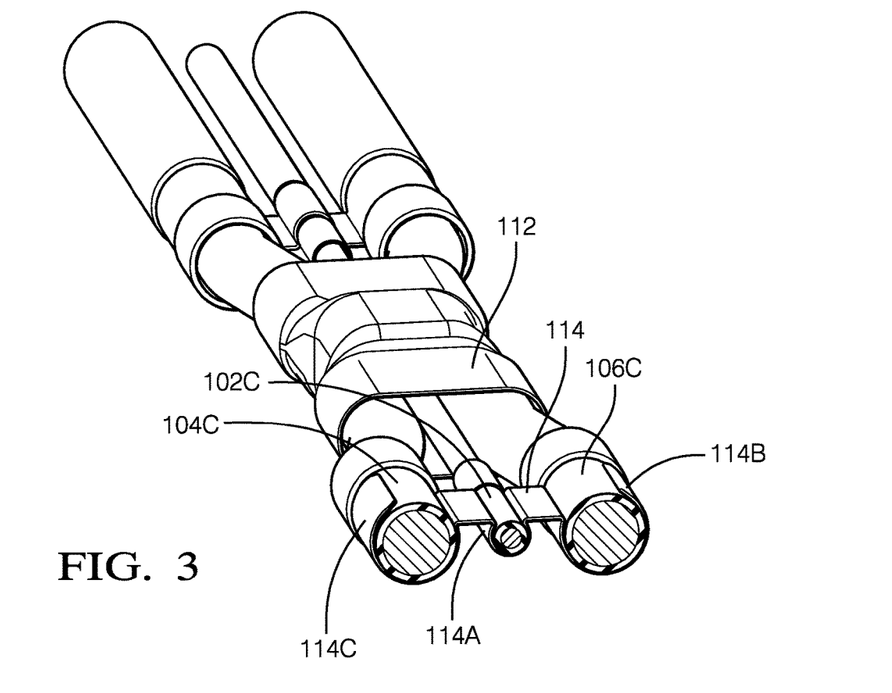
FIG. 3 is a partial assembly view of the shielded wire harness assembly of FIG. 2 in accordance with the first embodiment.
Figure 4:
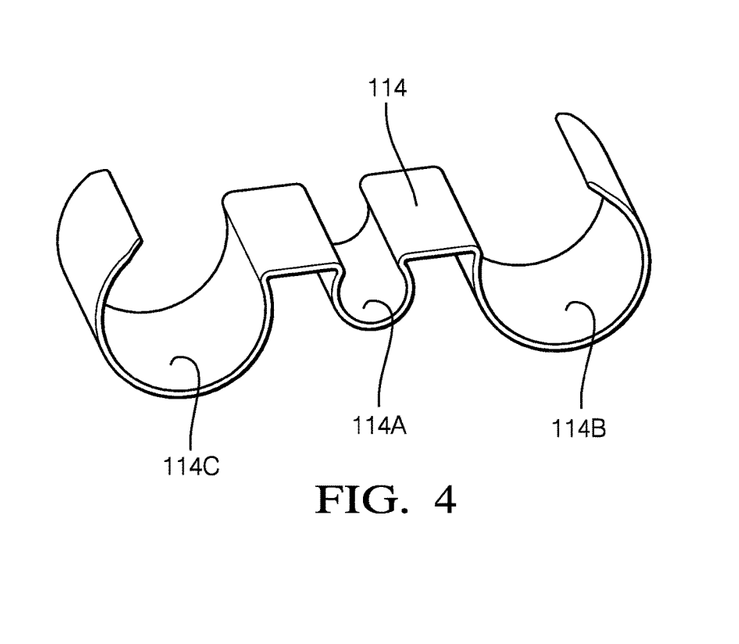
FIG. 4 is perspective view of a shield clip of the shielded wire harness assembly of FIG. 2 in accordance with the first embodiment.
Figure 5:
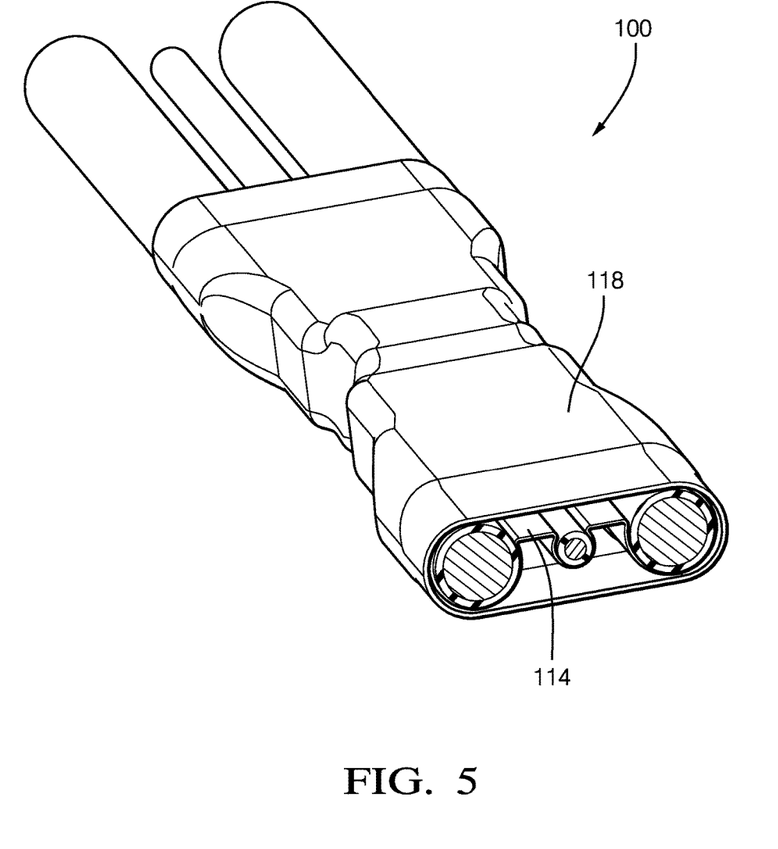
FIG. 5 is a partial assembly view of the shielded wire harness assembly of FIG. 2 including a conductive shield sleeve in accordance with the first embodiment.

As illustrated in FIGS. 2 and 3, the assembly 100 includes a shield clip 114 attached to the exposed shield conductors 102C, 104C, 106C. As best shown in the shield clip 114 has a mesial first receiving portion 114A in which the first exposed shield conductors 102C is received and two distal receiving portions 114B, 114C in which the second and third exposed shield conductors 104C, 106C are received. The shield clip 114 is formed of a conductive material having resilient spring properties, such as a spring steel alloy or a tin plated brass alloy. As best shown in FIG. 4, the first receiving portion 114A is characterized as defining an omega (Ω) shape in cross-section while the second and third receiving portions 114B, 114C are characterized as having an arcuate shape in cross section. In the illustrated examples, the second and third receiving portions 114B, 114C have a generally constant radius and the arc of the arcuate shape spans more than 180 degrees. The receiving portions 114A, 114B, 14C exert a normal force on the exposed shield conductors 102C, 104C, 106C that are received within and mechanically retain the shielded wire cables 102, 104, 106 within the shield clip 114 and electrically interconnect the exposed shield conductors 102C, 104C, 106C to one another.

The wire cable assembly 100 further includes a shield sleeve 118 formed of a conductive material in which the inner insulator 112 and the shield clip 114 are enclosed. The conductive material used to form the shield sleeve 118 may be a braided wire tube formed of a tin plated copper alloy, a metallic tape, or a metalized plastic film. The shield sleeve 118 is in direct contact with outer surfaces of the second and third receiving portions 114B, 114C of the shield clip 114, thereby providing electrical continuity between the shield sleeve 118 and the exposed shield conductors 102C, 104C, 106C. As shown in FIG. 3, the shield sleeve 118 is not in direct contact with the first receiving portion 114A of the shield clip 114 or the first exposed shield conductor 102C.

The wire cable assembly 100 further includes an outer insulator, hereinafter referred to as a housing 122 formed of a nonconductive material and defining a cavity 124 that is configured to enclose the shield sleeve 118. The wire cable assembly 100 also includes a pair of end caps 126 that are designed to sealably engage the shielded wire cables 102, 104, 106 and sealably engage the housing 122. The end caps 126 and outer housing 122 are designed to provide environmental protection by keeping contaminants such as dust, dirt, water, and other fluids away from to the exposed core conductors 102A, 104A, 106A, shield clip 114, and shield sleeve 118. The housing 122 and end caps 126 may be formed of a polymer material, such as NYLON or PBT. The end caps 126 may also include a sealing element formed of compliant material, such as silicone rubber, hereinafter referred to as seals 128.

In an alternative embodiment, the outer insulator may be formed by applying heat shrink tubing over the shield sleeve.

Figure 6:
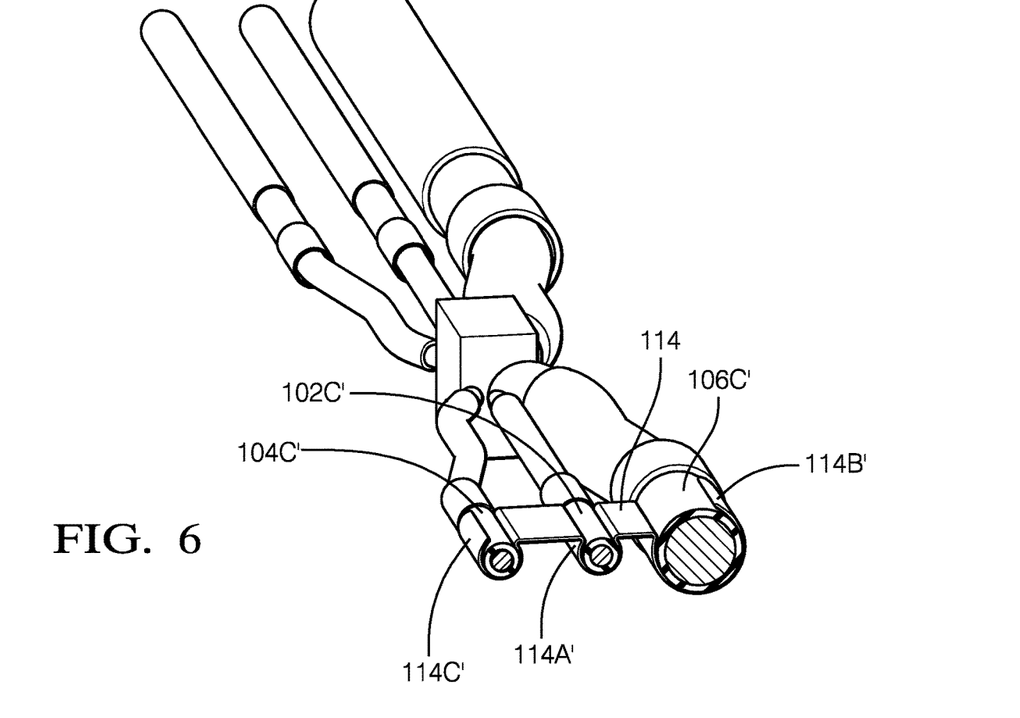
FIG. 6 is a partial assembly view of the shielded wire harness assembly of FIG. 2 in accordance with a second embodiment.
Figure 7:
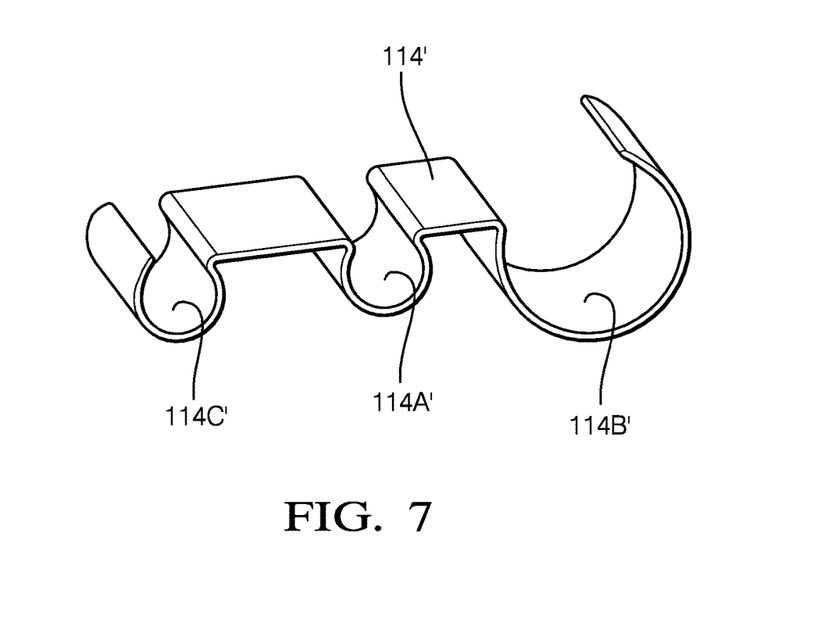
FIG. 7 is perspective view of a shield clip of the shielded wire harness assembly of FIG. 6 illustrating an open cavity in accordance with the second embodiment.
Figure 8:
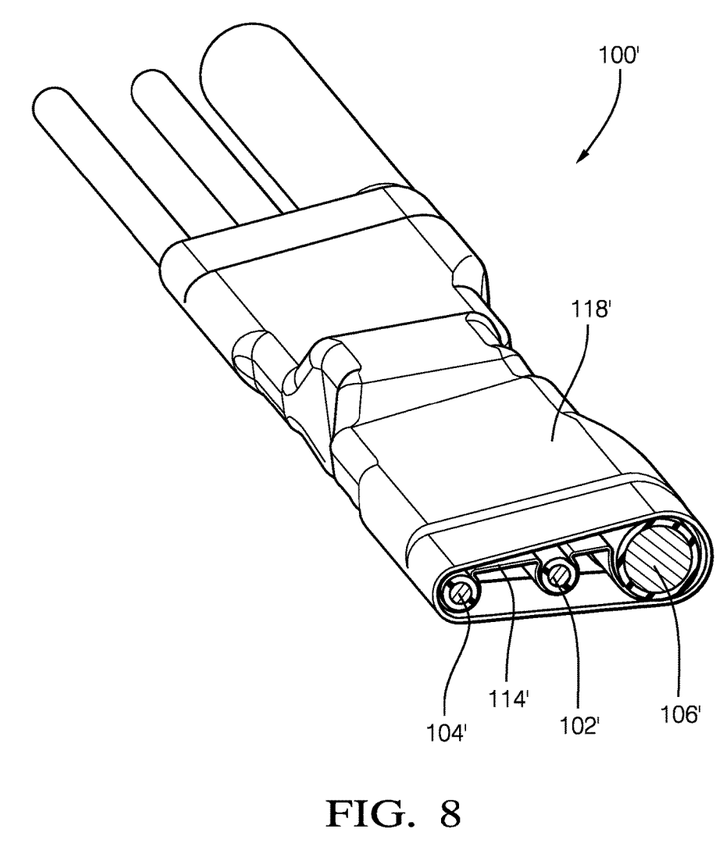
FIG. 8 is a partial assembly view of the shielded wire harness assembly of FIG. 6 including a conductive shield sleeve in accordance with the second embodiment.

FIGS. 6-8 illustrate an alternative embodiment of the assembly 100' wherein the first and third shielded wire cables 102', 106' received within the first and third wire receiving portions 114A, 114C of the shield clip 114 have the same diameter, which is smaller than the diameter of the second shielded wire cable 104' received within the second wire receiving portion 114B and in contact with the sleeve 118'.

Figure 9:
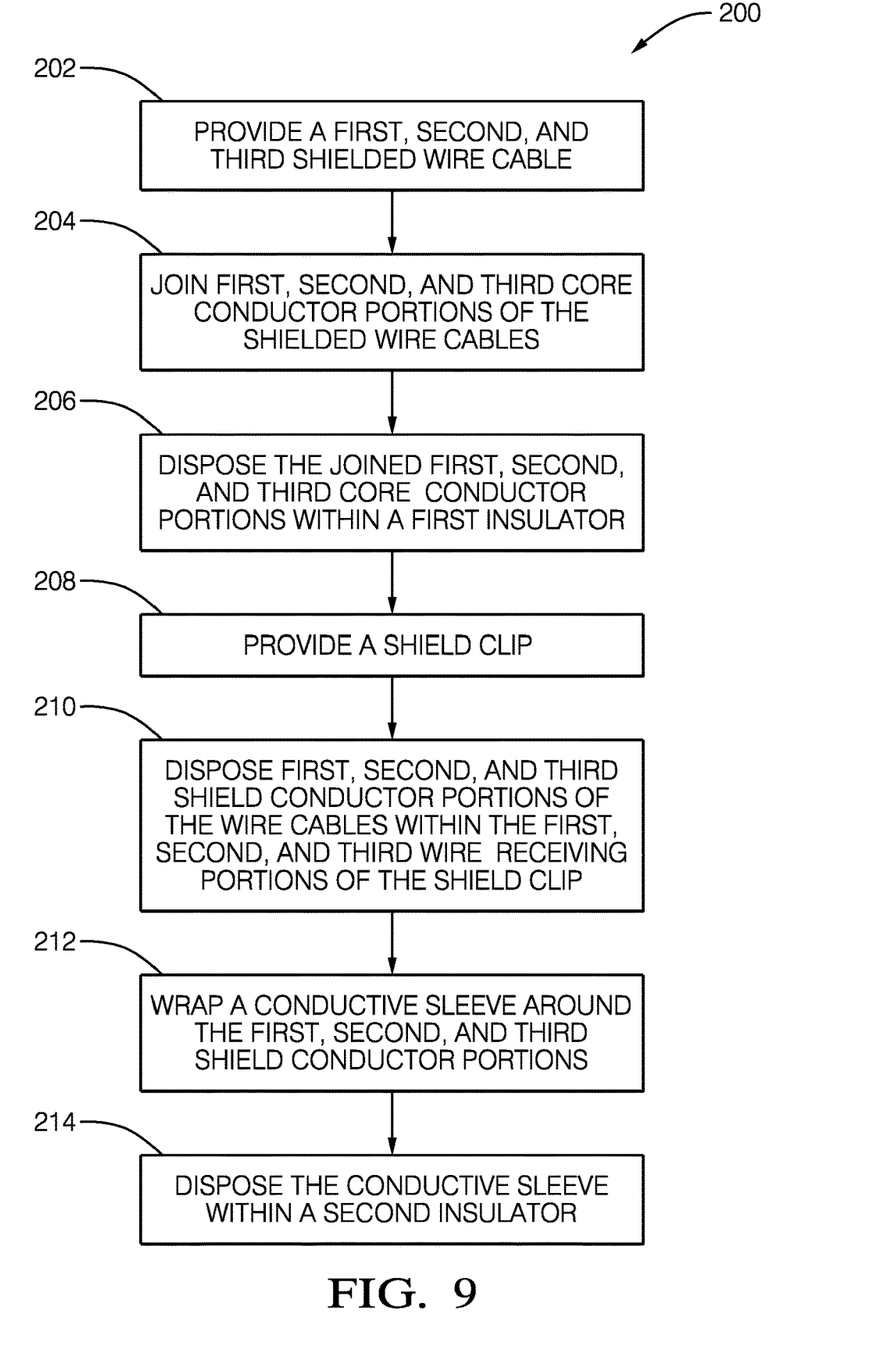
FIG. 9 is a flow chart of a method of splicing shielded wire cables together in accordance with a third embodiment.

FIG. 9 illustrates a non-limiting method 200 of splicing shielded wire cables together. The method 200 includes the following steps.

STEP 202, PROVIDE A FIRST, SECOND, AND THIRD SHIELDED WIRE CABLE, includes providing a first shielded wire cable 102 having a first core conductor portion 102A and a first shield conductor portion 102C, providing a second shielded wire cable 104 having a second core conductor portion 104A and a second shield conductor portion 104C, and providing a third shielded wire cable 106 having a third core conductor portion 106A and a third shield conductor portion 106C. A diameter of the first shielded wire cable 102 is different than a diameter of the second shielded wire cable 104.

STEP 204, JOIN FIRST, SECOND, AND THIRD CORE CONDUCTOR PORTIONS OF THE SHIELDED WIRE CABLES, includes joining the first, second, and third core conductor portions 102A, 104A, 106A of the shielded wire cables 102, 104, 106, thereby electrically interconnecting the first, second, and third core conductor portions 102A, 104A, 106A.

STEP 206, DISPOSE THE JOINED FIRST, SECOND, AND THIRD CORE CONDUCTOR PORTIONS WITHIN A FIRST INSULATOR, is an optional step that includes disposing the joined first, second, and third core conductor portions 102A, 104A, 106A within a first insulator 112.

STEP 208, PROVIDE A SHIELD CLIP, includes providing a resilient shield clip 114 formed of a conductive material defining a first wire receiving portion 114A characterized as being omega-shaped in cross section and a second and third wire receiving portion 114B 114C configured to receive the second and third shield conductor portions 104C, 106C.

STEP 210, DISPOSE FIRST, SECOND, AND THIRD SHIELD CONDUCTOR PORTIONS OF THE WIRE CABLES WITHIN THE FIRST, SECOND, AND THIRD WIRE RECEIVING PORTIONS OF THE SHIELD CLIP, includes disposing the first, second, and third shield conductor portions 102C, 104C, 106C within the first, second, and third wire receiving portions 114A, 114B, 114C respectively, thereby electrically interconnecting the first, second, and third shield conductor portions 102C, 104C, 106C.

STEP 212, WRAP A CONDUCTIVE SLEEVE AROUND THE FIRST, SECOND, AND THIRD SHIELD CONDUCTOR PORTIONS, includes wrapping a conductive shield sleeve 118 around the first, second, and third shield conductor portions, wherein the conductive shield sleeve 118 is in electrical contact with the shield clip 114, thereby electrically interconnecting the first, second, and third shield conductor portions 102C, 104C, 106C with the shield clip 114.

STEP 214, DISPOSE THE CONDUCTIVE SLEEVE WITHIN A SECOND INSULATOR, is an optional step that includes disposing the conductive shield sleeve 118 within a second insulator 122.

Accordingly, a wire cable assembly 100 and a method 200 for manufacturing such a wire harness assembly 100 are provided. The shield clip 114 provides the benefit of interconnecting shield conductors 1202C, 104C, 106C of shielded cables 102, 104, 106 and the conductive shield sleeve 118 even when the shielded cables 102, 104, 106 have differing diameters. The shield clip 114 also provides consistent spacing between the shielded cables 102, 104, 106 which can facilitate attachment of housing end caps 126 or seals 128 to the assembly 100.

While this invention has been described in terms of the preferred embodiments thereof, it is not intended to be so limited, but rather only to the extent set forth in the claims that follow. For example, other alternative embodiments may result by combining features of one of the above-described embodiments with any of the other above-described embodiments. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

In the following claims, the terms "including" and "in which" are used as the plain-English equivalents of the respective terms "comprising" and "wherein." Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items. Additionally, directional terms such as upper, lower, etc. do not denote any particular orientation, but rather the terms upper, lower, etc. are used to distinguish one element from another and locational establish a relationship between the various elements.

Further, the limitations of the following claims are not written in means-plus-function format and are not intended to be interpreted based on 35 USC § 112(f), unless and until such claim limitations expressly use the phrase "means for" followed by a statement of function void of further structure.

We claim:

1. A wire harness assembly, comprising:
   a first shielded wire cable having a first core conductor portion and a first shield conductor portion;
   a second shielded wire cable having a second core conductor portion and a second shield conductor portion;
   a third shielded wire cable having a third core conductor portion and a third shield conductor portion, wherein the first, second, and third core conductor portions are electrically interconnected and wherein a diameter of the first shielded wire cable is different than a diameter of the second shielded wire cable;
   a resilient shield clip formed of a conductive material in electrical contact with the first, second, and third shield conductor portions, wherein the shield clip defines a first wire receiving portion characterized as being omega-shaped in cross section and wherein the first shield conductor portion is received within the first wire receiving portion, and wherein the shield clip further defines second and third wire receiving portions in which the second and third shield conductor portions are received respectively; and
   a conductive shield sleeve in electrical contact with the shield clip and enclosing the first, second, and third shield conductor portions.

2. The wire harness assembly according to claim 1, wherein the second and third receiving portions are characterized as having an arcuate shape in cross section and wherein the second and third shield conductor portions are received within the second and third receiving portions respectively.

3. The wire harness assembly according to claim 1, wherein the second and third shielded wire cables have the same diameter.

4. The wire harness assembly according to claim 1, wherein the first and second shielded wire cables have the same diameter.

5. The wire harness assembly according to claim 1, wherein the first, second, and third core conductor portions are mechanically joined by a welding process.

6. The wire harness assembly according to claim 5, wherein the welding process is a sonic welding process.

7. The wire harness assembly according to claim 1, wherein the conductive shield sleeve is formed of braided metallic wires.

8. The wire harness assembly according to claim 1, wherein the conductive shield sleeve is formed of a conductive tape.

9. The wire harness assembly according to claim 1, wherein the conductive shield sleeve is in electrical contact with the first shield conductor portion and not in direct mechanical contact with the first shield conductor portion.

10. The wire harness assembly according to claim 1, wherein the wire harness assembly further comprises:
    a first insulator enclosing the joined first, second, and third core conductor portions; and
    a second insulator enclosing the conductive shield sleeve.

11. A method of manufacturing a wire harness assembly, comprising the steps of:
    providing a first shielded wire cable having a first core conductor portion and a first shield conductor portion;
    providing a second shielded wire cable having a second core conductor portion and a second shield conductor portion;
    providing a third shielded wire cable having a third core conductor portion and a third shield conductor portion, wherein a diameter of the first shielded wire cable is different than a diameter of the second shielded wire cable;
    joining the first, second, and third core conductor portions, thereby electrically interconnecting the first, second, and third core conductor portions;
    providing a resilient shield clip formed of a conductive material defining a first wire receiving portion characterized as being omega-shaped in cross section and a second and third wire receiving portion configured to receive the second and third shield conductor portions;
    disposing the first, second, and third shield conductor portions within the first, second, and third wire receiving portions respectively, thereby electrically interconnecting the first, second, and third shield conductor portions;
    wrapping a conductive shield sleeve around the first, second, and third shield conductor portions, wherein the conductive shield sleeve is in electrical contact with the shield clip, thereby electrically interconnecting the first, second, and third shield conductor portions with the shield clip.

12. The method according to claim 11, wherein the second and third receiving portions are characterized as having an arcuate shape in cross section.

13. The method according to claim 11, wherein the second and third shielded wire cables have the same diameter.

14. The method according to claim 11, wherein the first and second shielded wire cables have the same diameter.

15. The method according to claim 11, wherein the step of joining the first, second, and third core conductor portions is performed by a welding process.

16. The method according to claim 15, wherein the welding process is a sonic welding process.

17. The method according to claim 11, wherein the conductive shield sleeve is formed of braided metallic wires.

18. The method according to claim 11, wherein the conductive shield sleeve is formed of a conductive tape.

19. The method according to claim 11, wherein the conductive shield sleeve is in electrical contact with the first shield conductor portion and not in direct mechanical contact with the first shield conductor portion.

20. The method according to claim 11, wherein the method further comprises the steps of:
    disposing the joined first, second, and third core conductor portions within a first insulator; and
    disposing the conductive shield sleeve within a second insulator.

\* \* \* \* \*